United States Patent
Russel et al.

(10) Patent No.: US 7,268,447 B2
(45) Date of Patent: Sep. 11, 2007

(54) POWER CONTROL CENTER WITH SOLID STATE DEVICE FOR CONTROLLING POWER TRANSMISSION

(75) Inventors: Kenneth J Russel, Westland, MI (US); James L Jones, Belleville, MI (US); Baris Arakelian, Belleville, MI (US); Alexander Shoshiev, Beverly Hills, MI (US)

(73) Assignee: Yazaki North America, Inc., Canton, MI (US)

( * ) Notice: Subject to any disclaimer, the term of this patent is extended or adjusted under 35 U.S.C. 154(b) by 295 days.

(21) Appl. No.: 11/120,867

(22) Filed: May 3, 2005

(65) Prior Publication Data

US 2006/0192439 A1     Aug. 31, 2006

Related U.S. Application Data

(60) Provisional application No. 60/606,295, filed on Sep. 1, 2004.

(51) Int. Cl.
  *B60L 1/00* (2006.01)
  *H01H 35/00* (2006.01)
  *H02M 1/00* (2006.01)
  *H01R 31/08* (2006.01)

(52) U.S. Cl. .................. 307/10.1; 307/126; 363/144

(58) Field of Classification Search ........ 363/144–147; 439/194, 511, 529, 530, 620.01, 620.15, 620.21; 307/9.1, 10.1, 125, 126, 130, 140, 141.4, 307/142, 143; 200/237, 238, 284, 303
See application file for complete search history.

(56) References Cited

U.S. PATENT DOCUMENTS

| | | | |
|---|---|---|---|
| 4,872,089 A | 10/1989 | Ocken et al. | |
| 5,130,888 A | 7/1992 | Moore | |
| 5,144,282 A | 9/1992 | Sutterlin et al. | |
| 5,235,317 A | 8/1993 | Sutterlin et al. | |
| 5,613,598 A * | 3/1997 | Pittman et al. | 200/295 |
| 5,747,877 A | 5/1998 | Wilson | |
| 5,844,761 A | 12/1998 | Place, IV | |
| 5,892,426 A * | 4/1999 | Huang | 337/59 |
| 6,055,149 A | 4/2000 | Gillberg et al. | |
| 6,111,758 A | 8/2000 | Dowd | |
| 6,476,481 B2 | 11/2002 | Woodworth et al. | |
| 6,525,639 B1 * | 2/2003 | Cheng | 337/37 |
| 6,583,973 B1 | 6/2003 | Pärn | |
| 6,693,370 B2 * | 2/2004 | Yamane et al. | 307/10.1 |
| 6,751,080 B2 | 6/2004 | Yamaji | |
| 6,984,141 B1 * | 1/2006 | Beski et al. | 439/188 |
| 7,189,108 B2 * | 3/2007 | Takaya et al. | 439/511 |

* cited by examiner

*Primary Examiner*—Matthew V. Nguyen
(74) *Attorney, Agent, or Firm*—Harness, Dickey & Pierce, P.L.C.

(57) ABSTRACT

An automotive power control center that includes a housing, a first conductor coupled to the housing, a second conductor, a control circuit, which is coupled to the housing, and a semiconductor. The second conductor is coupled to the housing and insulated from the first conductor. The solid-state device includes a first terminal, which is electrically coupled to the first conductor, a second terminal, which is electrically coupled to the second conductor, and a third terminal, which is electrically coupled to the control circuit. The solid-state device is configured to selectively control transmission of electricity between the first and second terminals in response to a signal transmitted from the control circuit through the third terminal. In some embodiments the solid-state device may be removably coupled to the housing. In other embodiments, the solid-state device may be fixedly coupled to the various conductors and terminals.

22 Claims, 5 Drawing Sheets

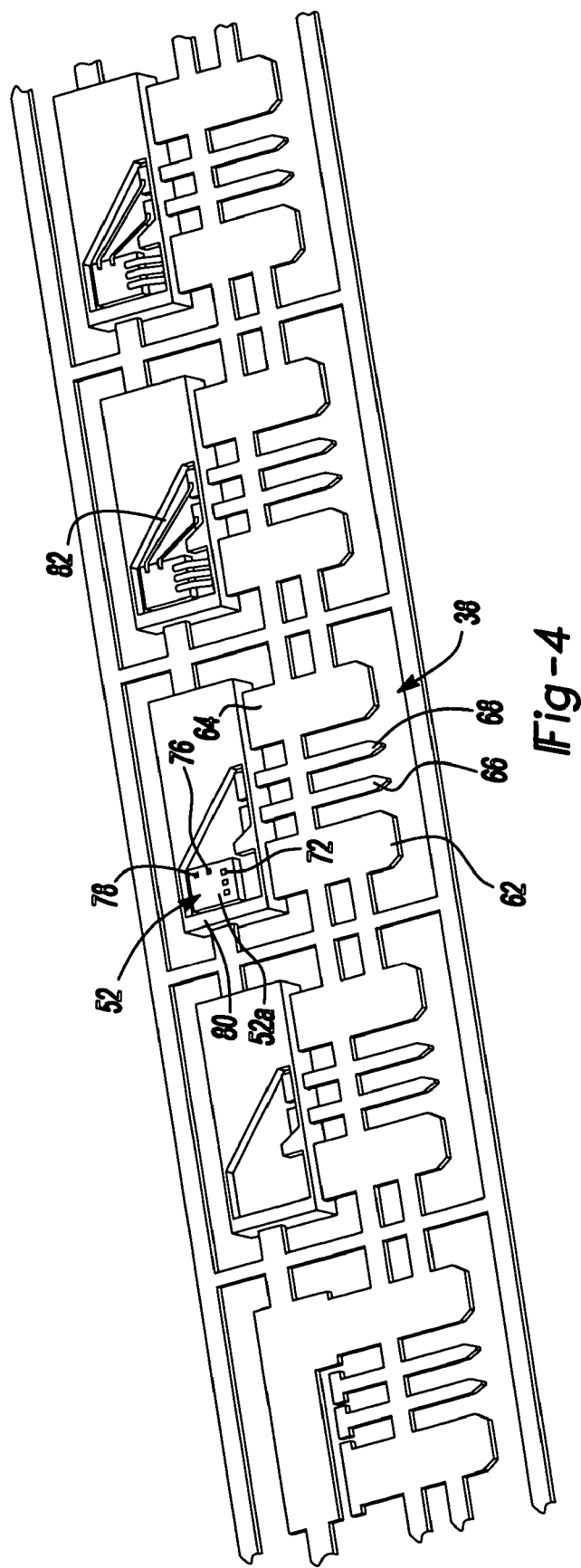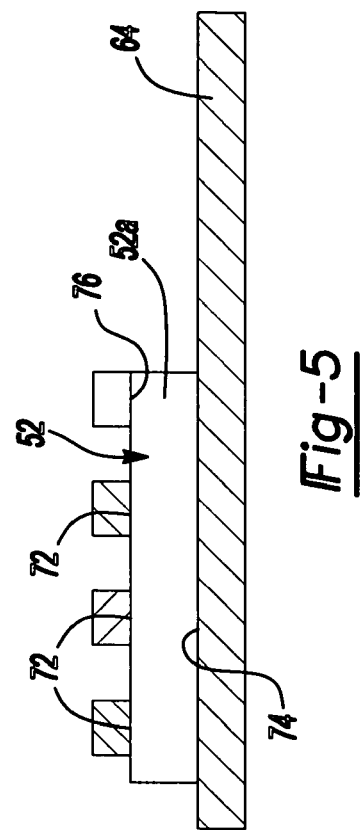

POWER CONTROL CENTER WITH SOLID STATE DEVICE FOR CONTROLLING POWER TRANSMISSION

This application claims priority to U.S. Provisional Patent Application Ser. No. 60/606,295 entitled "POWER CONTROL CENTER WITH SOLID STATE DEVICE FOR CONTROLLING POWER TRANSMISSION" filed Sep. 1, 2004. Other features described herein are claimed in co-pending U.S. patent application Ser. No. 11/120,865 filed on even date herewith.

INTRODUCTION

The present invention generally relates power switching devices and more particularly power switching devices that integrate controls circuitry and power switching circuitry.

An automotive power control center is typically the primary power switching and protection device that is located between a primary power source, such as the positive (B+) terminal of the vehicle battery, and various vehicle electrical devices, such as window and door motors, lights and HVAC fans, which are typically coupled to the automotive power control center via a wire harness. Presently, automotive power control centers may employ conventional componentry, such as relays, flashers and fuses, or a combination of conventional componentry and solid-state devices for power switching and management. Generally speaking, solid-state devices tend to have greater long-term reliability as compared to conventional components such as relays as they do not have moving parts. Furthermore, solid-state devices are generally smaller. Consequently, it is desirable that automotive power control centers include solid-state devices.

Solid-state devices are, however, more commonly employed in relatively low current circuits (i.e., circuits where typically less than 0.5 amp of current is employed). As modern vehicles employ both high and low current circuits, traditional components, such as relays, are still widely used in automotive power control centers. In practice, low current circuitry, which is commonly mounted on a circuit board, is commonly employed to control the relays to distribute high-current power from a bus bar to another bus bar or wire harness. Configuration of the automotive power control center in this manner presents several problems, however.

For example, implementation of connections of low and high-current circuits to relays necessitates the use of multiple layers of bus bars. This approach, however, results in increased cost and weight of the power center, as well as a commensurate increase in the complexity and cost of the tools used to produce it. It would therefore be beneficial to employ solid-state devices to perform the switching of power.

Usage of board-mounted solid-state devices for high-power switching in the current art presents some other problems, however. In this regard, the various solid-state components often times generate significant amounts of heat and as such, a relatively large heat sink solution must generally be provided to dissipate the heat to a location outside the power center. In addition, the need to connect the solid-state device with primary source of power for input and with wire harness for output, typically results in employing wide and thick copper traces on the board. This results in usage of heavy-copper boards and an increase of board size and complexity. Consequently, the costs associated with the circuit board tend to be relatively high.

In view of these drawbacks, there remains a need in the art for an improved automotive power control center that utilizes solid-state devices for the control and switching of all types of current loads.

SUMMARY

In one form, the present teachings provide an automotive power control center that includes a housing, a first conductor coupled to the housing, a second conductor, a control circuit, which is coupled to the housing, and a semiconductor. The second conductor is coupled to the housing and insulated from the first conductor. The solid-state device includes a first terminal, which is electrically coupled to the first conductor, a second terminal, which is electrically coupled to the second conductor, and a third terminal, which is electrically coupled to the control circuit. The solid-state device is configured to selectively control transmission of electricity between the first and second terminals in response to a signal transmitted from the control circuit through the third terminal. In some embodiments the solid-state device may be removably coupled to the housing. In other embodiments, the solid-state device may be fixedly coupled to the various conductors and terminals.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Additional advantages and features of the present invention will become apparent from the subsequent description and the appended claims, taken in conjunction with the accompanying drawings, wherein:

FIG. 4 is a perspective view of a lead frame progression illustrating one method for manufacturing a solid-state device constructed in accordance with the teachings of the present invention;

FIG. 5 is a sectional view taken along the line 5-5 of FIG. 3;

DETAILED DESCRIPTION OF THE VARIOUS EMBODIMENTS

Figure 1:
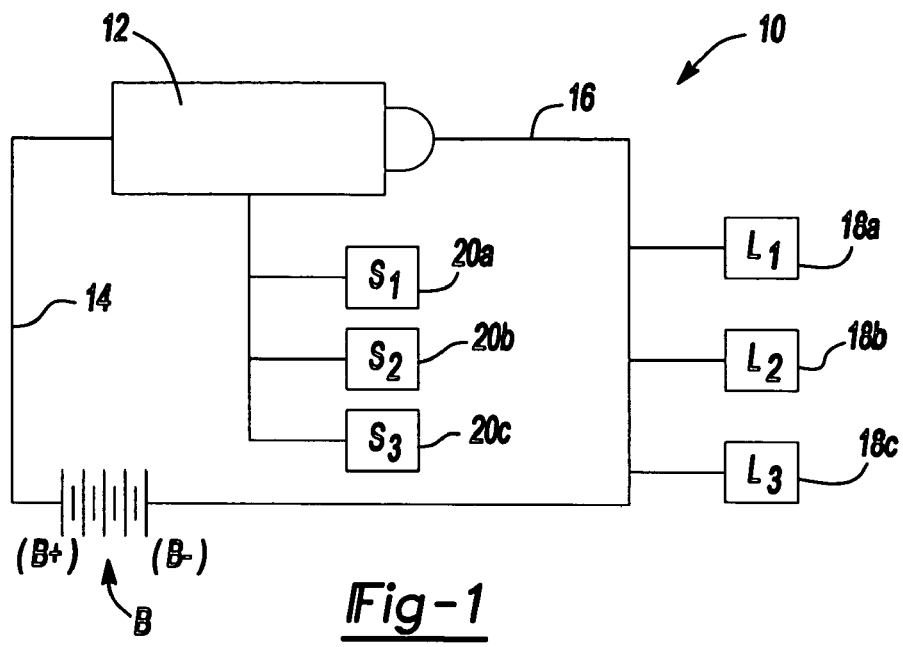
FIG. 1 is a schematic view of a vehicle having an automotive power control center constructed in accordance with the teachings of the present invention.

With reference to FIG. 1 of the drawings, a vehicle 10 is illustrated to include an automotive power control center 12 that is constructed in accordance with the teachings of the present invention. The vehicle 10 is schematically illustrated to also include a battery B, a first wire harness 14, a second wire harness 16 and a plurality of load devices 18a, 18b and 18c. The first wire harness 14 may operably couple the B+ terminal of the battery B to the power control center 12, while the second wire harness 16 may operably couple the power control center 12 to the several load devices 18a, 18b and 18c and the B− terminal of the battery B. For ease of illustration and discussion the second wire harness 16 has been illustrated as being directly coupled to the B− terminal of the battery B. Those of ordinary skill in the art will appreciate, however, that the second wire harness 16 need not be directly coupled to the B− terminal but rather may employ a tertiary conductor, such as the vehicle body (not shown), in a manner that is well known in the art. The load devices 18a, 18b and 18c may be any type of electrically-powered device and may comprise common vehicle components such as motors, solenoids, fans, refrigerant compressors, that may be selectively operated by a vehicle occupant through means such as switches 20a, 20b and 20c, respectively. Although the example provided is illustrated and described as employing a plurality of switches to selectively control the operation of one or more load devices, it will be understood that the operation of the load devices may be controlled in response to the generation of any type of signal, whether manually or automatically generated.

Figure 2:
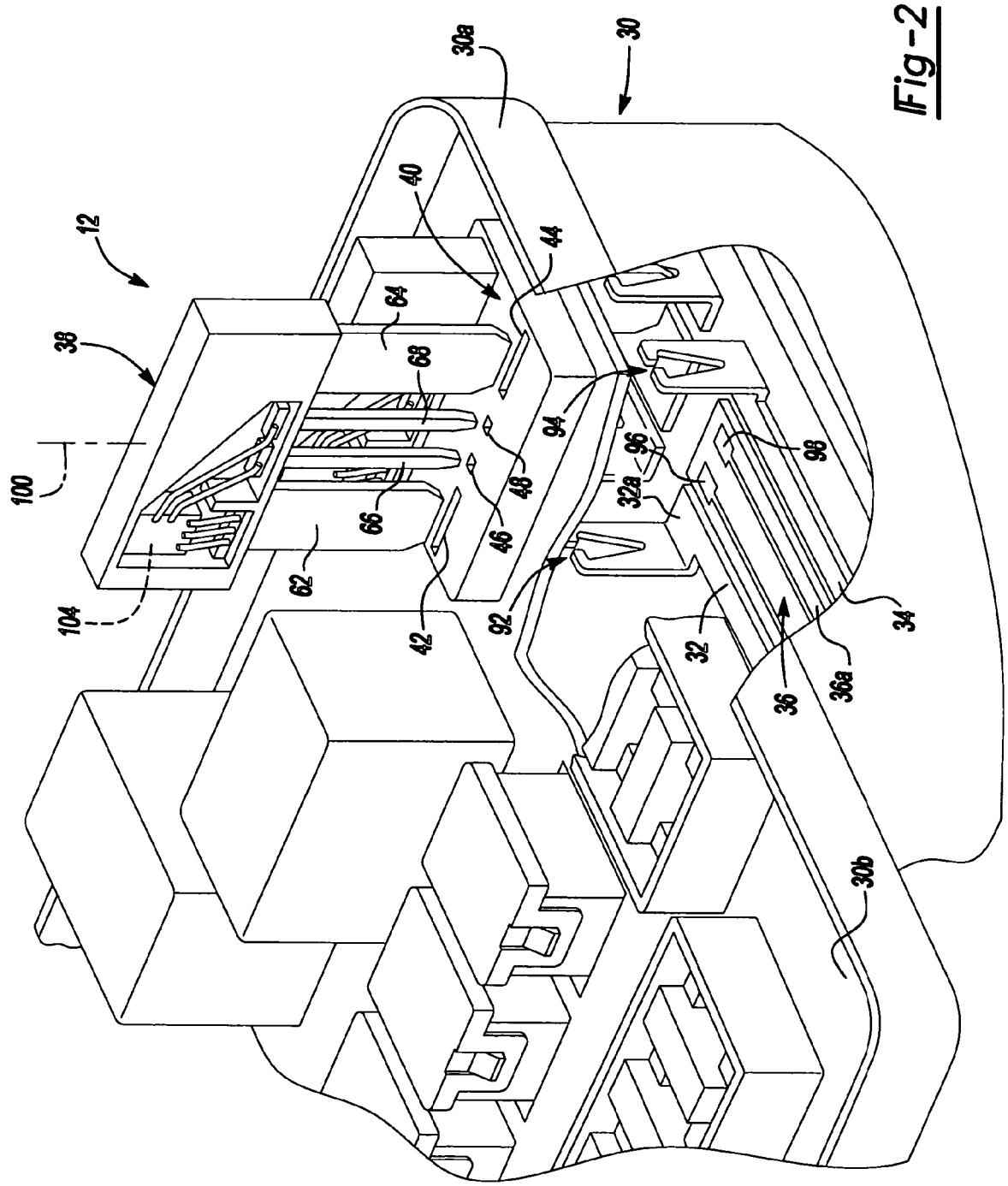
FIG. 2 is an exploded and partially broken away perspective view of a portion of the automotive power control center of FIG. 1.

In FIG. 2, the power control center 12 may include a housing 30, a first conductor 32, a second conductor 34, a control circuit 36 and a solid-state device 38. The housing 30 may include one or more housing members (e.g., 30a, 30b) and may be configured to house the first conductor 32, the second conductor 34 and/or the control circuit 36. In the particular example provided, the first conductor 32 is a bus bar 32a that is coupled to the B+ terminal (FIG. 1) of the battery B (FIG. 1) and entirely housed in the housing 30, while the second conductor 34 is electrically isolated from the first conductor 32 and may be a second bus bar or a wire harness terminal. An upper housing member 30b may define a coupling nest 40 into which the solid-state device 38 is received. More specifically, the coupling nest 40 may define a first leg aperture 42, a second leg aperture 44, a third leg aperture 46 and optionally one or more auxiliary leg apertures 48. While each of the leg apertures 42, 44, 46 and 48 is illustrated as being individually formed, it will be appreciated that in some situations, one or more of the leg apertures may be interconnected.

The control circuit 36 may be coupled to the housing 30 and is configured to receive relatively low-current signals from various components within the vehicle 10 (FIG. 1), such the switches 20a, 20b and 20c (FIG. 1). In the example provided, the control circuit 36 includes a printed circuit board 36a but it will be appreciated that other types of control circuits may additionally or alternatively be employed.

Figure 3:
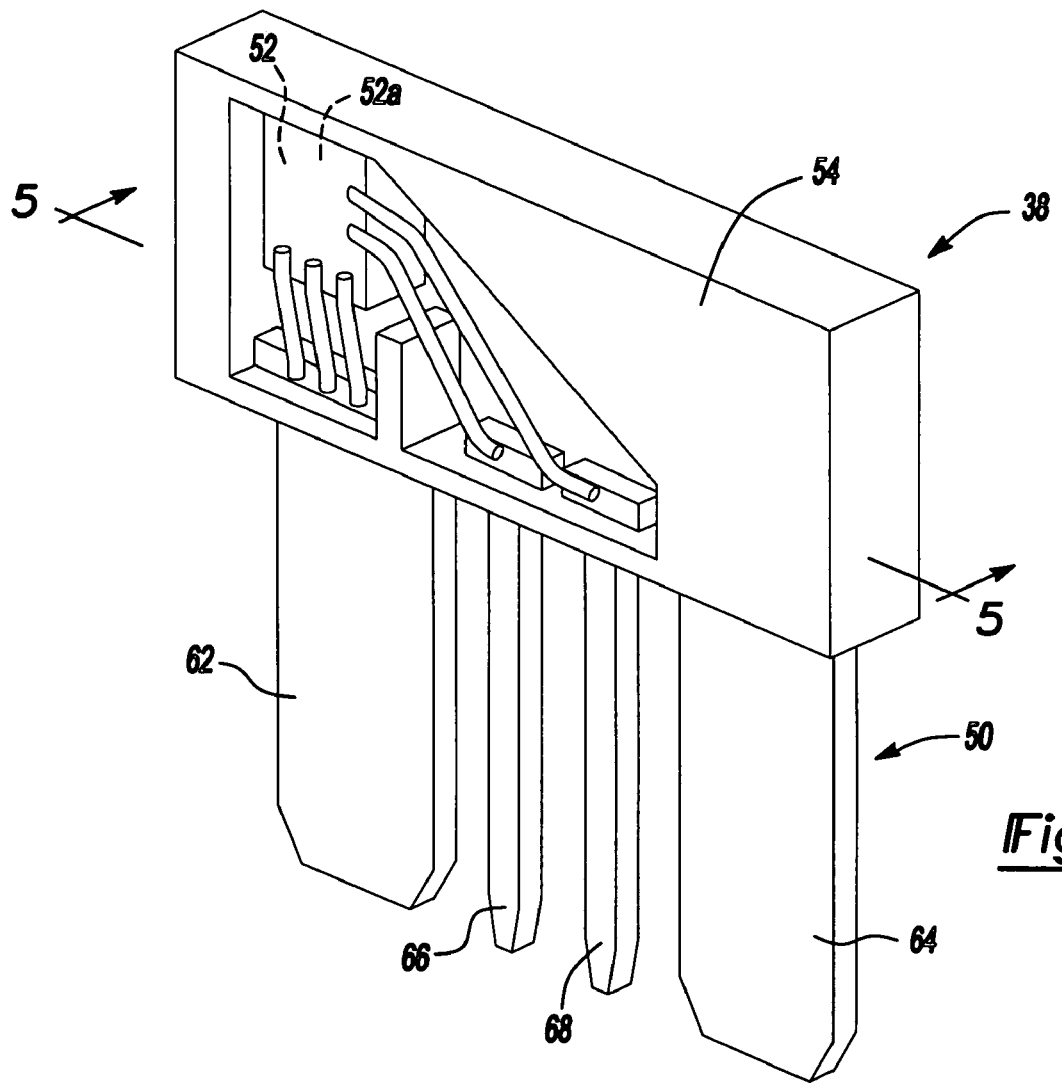
FIG. 3 is a perspective view of a portion of the automotive power control center of FIG. 1 illustrating one type of solid-state device in greater detail.

With reference to FIG. 3, the solid-state device 38 may include a lead frame 50, a semiconductor 52 and an insulator 54. The lead frame 50 defines a first leg 62, a second leg 64, a third leg 66 and optionally one or more auxiliary legs. In the example provided, the lead frame 50 defines one auxiliary leg 68. Also in the example provided, each of the first, second, third and auxiliary legs 62, 64, 66 and 68 is illustrated to be male spade terminals which are generally parallel one another. It will be appreciated, however, that other leg configurations and/or constructions may be employed in the alternative. With additional reference to FIGS. 4 and 5, the semiconductor 52, which is illustrated to comprise a single semiconductor die 52a but which could comprise a plurality of semiconductor dies, includes an input terminal 72, an output terminal 74 and a control terminal 76, which are electrically coupled to the first leg 62, second leg 64, third leg 66, respectively, through any appropriate means, such as wire bonding or direct bonding. The semiconductor 52 may also include one or more auxiliary terminals 78, each of which being coupled to an associated auxiliary leg 68.

The insulator 54 at least partially covers the semiconductor 52 and may encapsulate the semiconductor 52 and/or portions of the first leg 62, the second leg 64, the third leg 66 and/or the auxiliary leg(s) 68. In the example provided, the insulator comprises a first portion 80, which partially encapsulates the first, second, third and auxiliary legs 62, 64, 66 and 68 and a second portion 82, which is overmolded onto the first portion 80 and the semiconductor 52.

Returning to FIG. 2, the solid-state device 38 is removably coupled to the housing 30 such that the first leg 62 extends through the first leg aperture 42 and is electrically coupled to the first conductor 32, the second leg 64 extends through the second leg aperture 44 and is electrically coupled to the second conductor 34, the third leg 66 extends through the third leg aperture 46 and is electrically coupled to the control circuit 36, and each auxiliary leg 68 extends through an associated auxiliary leg aperture 48 and is electrically coupled to the control circuit 36. In the example provided, the first conductor 32 and the second conductor 34 include terminals 92 and 94, respectively, that directly engage the first and second legs 62 and 64, when the solid-state device 38 is inserted to the coupling nest 40 of the housing 30 and the control circuit 36 includes terminals 96 and 98, respectively, that directly engage the third and auxiliary legs 66 and 68, respectively, when the solid-state device 38 is inserted to the coupling nest 40 of the housing 30.

The semiconductor 52 selectively controls transmission of electricity between the first and second legs 62 and 64 at least partially in response to a signal provided by the control circuit 36 through the third leg 66. The signal provided by the control circuit 36 may be in the form of a discrete signal of a predetermined voltage, or may be an electronic message (e.g., a serially transmitted message). To facilitate removable coupling of the solid-state device 38, the distal end of the first and second legs 62 and 64, which is located opposite the insulator 54, may terminate in a common plane that is generally transverse to an insertion axis 100 along which the solid-state device 38 is inserted into the coupling nest 40.

Each optional auxiliary leg 68 may be electrically coupled to the control circuit 36 and may permit an associated auxiliary signal to be transmitted between the semiconductor 52 and the control circuit 36. In the example provided, the semiconductor 52 includes an internal temperature sensor 104 and the semiconductor 52 transmits a signal to the control circuit 36 through the auxiliary leg 68 in response to a determination that a temperature of the semiconductor 52 exceeds a predetermined temperature. It will be appreciated that other types of sensors may additionally or alternatively be incorporated into the semiconductor 52 and/or that one or more of the auxiliary legs 68 may be employed to transmit a signal from the control circuit 36 to the semiconductor 52. It will also be appreciated that the first, second, third and auxiliary legs 62, 64, 66 and 68 may be formed to any desired length. For example, relatively short legs may be employed to interface directly to mating terminals in the control circuit 36 or to the bus bar, while relatively longer terminals may be employed to connect to wire harness terminals or directly to a connector of a wire harness (i.e., thereby eliminating the need for an intermediate bus bar connection to the wire harness). Moreover, it will be appreciated that the first, second, third and auxiliary legs 62, 64, 66 and 68 may be oriented and/or sized in any desired manner. For example, if spade terminal legs are employed, they may be sized in 1.5 mm, 2.8 mm and/or 6.3 mm sizes as desired to handle the power that is transmitted therethrough.

The power control center 12 has significant advantages over prior art power control centers, including: the coupling of the semiconductor 52 to a bus bar or other relatively large conductor, which provides generally higher current transmission capabilities and better heat dissipation as compared with traces on printed circuit boards, and a relatively high degree of modularity that may be readily adapted to a wide range of vehicles and vehicle models.

Figure 6:
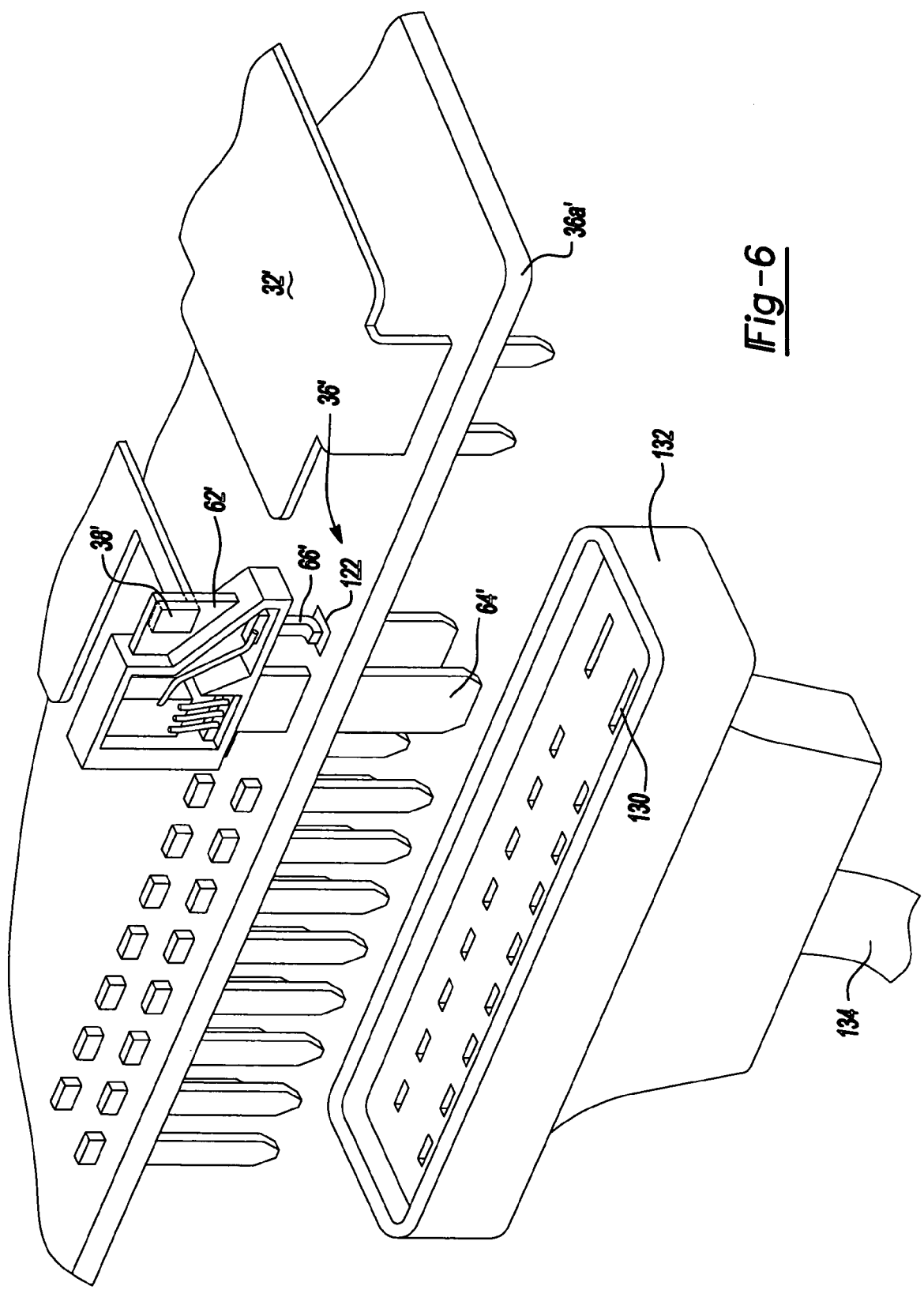
FIG. 6 is an exploded perspective view of a portion of a vehicle with a second automotive power control center constructed in accordance with the teachings of the present invention.
Figure 7:
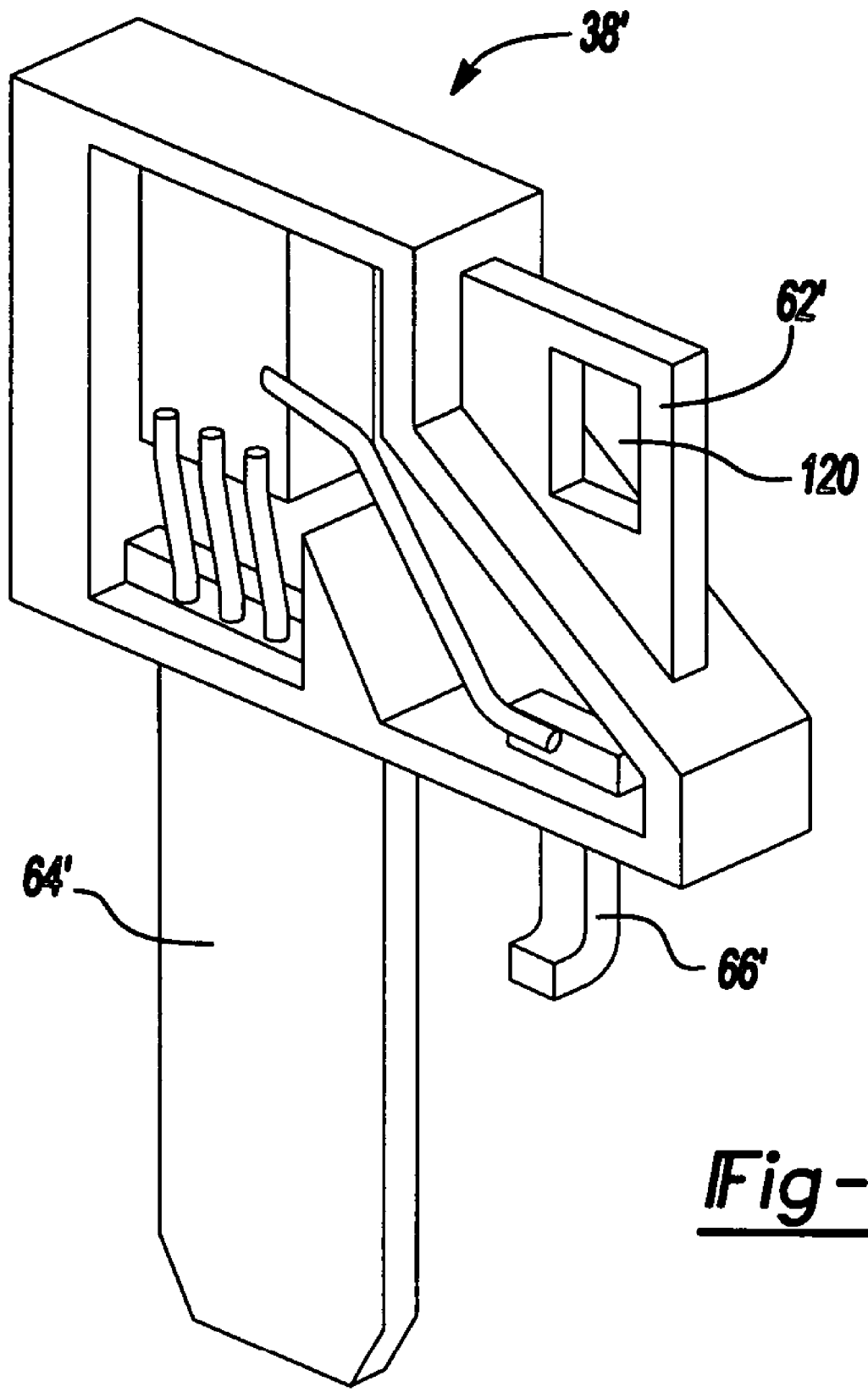
FIG. 7 is a perspective view of a portion of the automotive power control center of FIG. 6 illustrating another type of solid-state device in greater detail.

While the automotive power control center 12 has been illustrated and described as employing solid-state devices 38 that are removable (e.g., serviceable), it will be appreciated that the invention, in its broadest aspects, may be constructed somewhat differently. For example, one or more of the legs may be permanently coupled to an associated conductor or terminal as illustrated in FIGS. 6 and 7. In this example, the first leg 62' of the solid-state device 38' is fixedly coupled to a first conductor 32' that is electrically coupled to the B+ terminal of the vehicle battery, while the third leg 66' is coupled to a terminal on a control circuit 36' that is contained on a printed circuit board 36a'. The first leg 62' may include an aperture 120 into which the first conductor 32' is received and one or both of the first leg 62' and the first conductor 32' may be deformed (e.g., twisted) to mechanically fix the two together. Alternatively or additionally, the first leg 62' and the first conductor 32' may be fixed together via another means, such as welding, soldering or an electrically conductive adhesive. The third leg 66' may be mechanically engaged to a mating terminal or may be surface mounted to a terminal 122 in the control circuit 36' as is illustrated. The second leg 64' may extend generally transverse to the first leg 62' and extend from the power control center 12' in a manner that may be directly engaged by a terminal 130 of a connector 132 of a wire harness 134.

In view of the above, those of ordinary skill in the art will appreciate that a key advantage of a solid-state device constructed in accordance with the teachings of the present invention (e.g., solid-state devices 38 and 38') is that the semiconductor may be coupled to one or more terminals that may connect directly to a bus bar, a wire harness terminal or other similar type of heavy gauge conductor, thereby eliminating the need for multiple layers of bus bars and/or wide and thick copper traces formed on a printed circuit board.

While the invention has been described in the specification and illustrated in the drawings with reference to various embodiments, it will be understood by those skilled in the art that various changes may be made and equivalents may be substituted for elements thereof without departing from the scope of the invention as defined in the claims. Furthermore, the mixing and matching of features, elements and/or functions between various embodiments is expressly contemplated herein so that one of ordinary skill in the art would appreciate from this disclosure that features, elements and/or functions of one embodiment may be incorporated into another embodiment as appropriate, unless described otherwise, above. Moreover, many modifications may be made to adapt a particular situation or material to the teachings of the invention without departing from the essential scope thereof. Therefore, it is intended that the invention not be limited to the particular embodiment illustrated by the drawings and described in the specification as the best mode presently contemplated for carrying out this invention, but that the invention will include any embodiments falling within the foregoing description and the appended claims.

What is claimed is:

1. An automotive power control center comprising:
    a housing;
    a bus bar coupled to the housing and adapted to be coupled to a source of electrical energy;
    a conductor coupled to the housing and electrically insulated from the bus bar;
    a control circuit coupled to the housing; and
    a solid-state device having:
        a lead frame defining a first leg, a second leg and a third leg;
        a semiconductor having a input terminal, a output terminal and a control terminal, the input terminal being coupled to the first leg, the output terminal being coupled to the second leg and the control terminal being coupled to the third leg; and
        an insulator covering the semiconductor;
    wherein the solid state device is fixedly coupled to the housing such that the first leg is electrically coupled to the conductor, the second leg is electrically coupled to the bus bar, and the third leg extends is electrically coupled to the control circuit; and
    wherein the semiconductor selectively controls transmission of electricity between the first and second legs in response to a signal provided by the control circuit.

2. The automotive power control center of claim 1, wherein the conductor is a second bus bar.

3. The automotive power control center of claim 1, wherein the insulator encapsulates the semiconductor.

4. The automotive power control center of claim 3, wherein the insulator partially encapsulates the first, second and third legs.

5. The automotive power control center of claim 1, wherein the conductor is a wire harness terminal.

6. The automotive power control center of claim 1, wherein at least one of the first leg, the second leg and the third leg is a male spade terminal.

7. The automotive power control center of claim 1, wherein the first and second legs are generally transverse to one another.

8. The automotive power control center of claim 1, wherein the semiconductor includes at least one auxiliary leg that electrically couples the semiconductor to the control circuit to permit an associated auxiliary signal to be transmitted between the semiconductor and the control circuit.

9. The automotive power control center of claim 1, wherein the third leg directly contacts a terminal on the control circuit when the solid-state device is installed to the housing.

10. The automotive power control center of claim 1, wherein the semiconductor includes a single semiconductor die.

11. A method comprising:
    providing a power control center having a housing, a bus bar, a conductor and a control circuit, the bus bar being coupled to the housing and adapted to be coupled to a source of electrical energy, the conductor being coupled to the housing and electrically insulated from the bus bar, the control circuit being coupled to the housing;
    providing a solid state device having a lead frame, a semiconductor and an insulator, the lead frame defining a first leg, a second leg and a third leg, the semiconductor having a input terminal, a output terminal and a control terminal, the input terminal being coupled to the first leg, the output terminal being coupled to the second leg and the control terminal being coupled to the third leg, the insulator covering the semiconductor;

installing the solid-state device to the housing such that the first leg is electrically coupled to the conductor, the second leg is fixedly and electrically coupled to the bus bar, and the third leg is fixedly and electrically coupled to the control circuit.

12. The method of claim 11, further comprising transmitting a signal from the control circuit to the semiconductor to cause the semiconductor to transmit electrical energy between the output terminal and the input terminal.

13. The method of claim 12, wherein electricity transmitted between the output terminal and the input terminal has a current that exceeds about 0.5 amps.

14. The method of claim 13, wherein the current exceeds about 1.0 amp.

15. An automotive power control center comprising:
a housing;
a first conductor coupled to the housing;
a second conductor coupled to the housing and insulated from the first conductor;
a control circuit coupled to the housing; and
a solid state device having a first terminal, which is fixedly and electrically coupled to the first conductor, a second terminal, which is electrically coupled to the second conductor, and a third terminal, which is fixedly and electrically coupled to the control circuit, the solid state device being operable for selectively controlling transmission of electricity between the first and second terminals in response to a signal transmitted from the control circuit through the third terminal.

16. The automotive power control center of claim 15, wherein the solid-state device includes a semiconductor.

17. The automotive power control center of claim 16, wherein the semiconductor includes at least one auxiliary leg that electrically couples the semiconductor to the control circuit to permit an associated auxiliary signal to be transmitted between the semiconductor and the control circuit.

18. The automotive power control center of claim 15, wherein the first and second conductors are sized to handle a current load that is greater than or equal to about 0.5 amp.

19. The automotive power control center of claim 18, wherein the current load is greater than or equal to about 1.0 amp.

20. The automotive power control center of claim 15, wherein the signal is a predetermined voltage.

21. The automotive power control center of claim 15, wherein the signal is an electronically transmitted message comprising at least two characters.

22. The automotive power control center of claim 21, wherein the electronically transmitted message is transmitted in a serial format.

* * * * *